(12) United States Patent
Schultz et al.

(10) Patent No.: US 6,408,265 B1
(45) Date of Patent: Jun. 18, 2002

(54) METASTABILITY RISK SIMULATION ANALYSIS TOOL AND METHOD

(75) Inventors: Richard T. Schultz; Kevin J. Gearhardt, both of Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/233,529

(22) Filed: Jan. 20, 1999

(51) Int. Cl.⁷ .............................................. G06F 9/45
(52) U.S. Cl. ..................... 703/22; 327/141; 714/731; 716/4
(58) Field of Search ............... 703/13–22; 716/1–6; 327/141; 714/725–731

(56) References Cited

U.S. PATENT DOCUMENTS

| | | | |
|---|---|---|---|
| 4,982,118 A | 1/1991 | Lloyd | 307/480 |
| 5,014,226 A | 5/1991 | Horstmann et al. | 364/551.01 |
| 5,517,658 A * | 5/1996 | Gluss et al. | 716/6 |
| 5,539,652 A | 7/1996 | Tegethoff | 364/490 |
| 5,544,067 A | 8/1996 | Rostoker et al. | 364/489 |
| 5,826,061 A * | 10/1998 | Walp | 716/6 |
| 5,850,355 A * | 12/1998 | Molnar | 703/15 |

OTHER PUBLICATIONS

Agrawal et al, "DynaTAPP: Dynamic Timing Analysis With Partial Path Activation in Sequential Circuits", 1992 EURO–VHDL Design Automation Conference, pp. 138–141 (Sep. 1992).*

Zarrinfar et al, "Static–Timing Analysis Speeds Verification", Electronic Engineering Times, pp. 76 et seq (download text)(May 13, 1996).*

Rogina et al, "Metastability Evaluation Method by Propagation Delay Distribution Measurement", IEEE Proceedings of the Fourth Test Symposium, pp. 40–44 (Nov. 1995).*

Unger, "Hazards, Critical Races, and Metastability", IEEE Transactions on Computers, vol. 44 No. 6, pp. 754–768 (Jun. 1995).*

Horstmann et al, "Metastability Behavior of CMOS ASIC Flip–Flops in Theory and Test", IEEE Journal of Solid–State Circuits, vol. 24 No. 1, pp. 146–157 (Feb. 1989).*

Metastability Evaluation Method by Propagation Delay Distribution Measurement; World Wide Web, two pages; http://www.computer/org/conferen/proceed/ats95/abstract.htm#40.

* cited by examiner

Primary Examiner—Kevin J. Teska
Assistant Examiner—Samuel Broda
(74) Attorney, Agent, or Firm—Trexler, Bushnell, Giangiorgi, Blackstone & Marr Ltd.

(57) ABSTRACT

A metastability risk simulation analysis device and method for identifying metastability risks of a design. The metastability risk simulation analysis device includes computer readable code which is configured to analyze simulation information relating to the design and determine whether the design presents a metastability risk. Desirably, the computer readable code is configured to determine whether two signals, such as a data signal and a clock signal of a synchronous element of the design, cross over each other thereby presenting a metastability risk, and is configured to generate a summary report identifying those synchronous elements of the design which present a metastability risk. Preferably, the computer readable code is configured to analyze simulation information relating to best case and worst case simulations of the design, and is configured to scan the simulation information to identify an edge of a clock signal and an edge of a data signal of the best case and worst case simulations and determine whether the signals cross each other.

9 Claims, 7 Drawing Sheets

| time (ns) | flip flop a-ck | flip flop a-d |
|---|---|---|
| 0 | 0 | 0 |
| 2 | 1 | 0 |
| 3 | 1 | 1 |
| 14 | 0 | 1 |
| 27 | 1 | 1 |
| 39 | 0 | 1 |
| 52 | 1 | 1 |
| 64 | 0 | 1 |
| 77 | 1 | 1 |
| 78 | 1 | 0 |
| 89 | 0 | 0 |
| 102 | 1 | 0 |
FIG._1
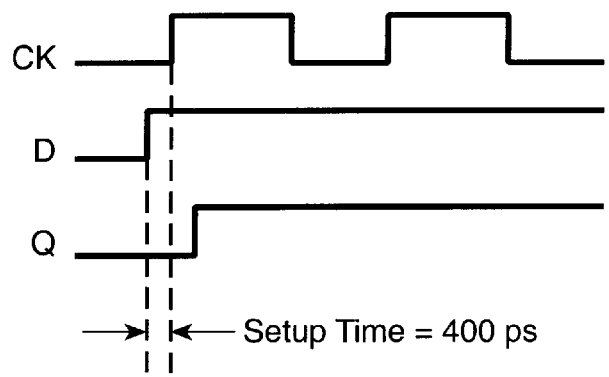
FIG._2A
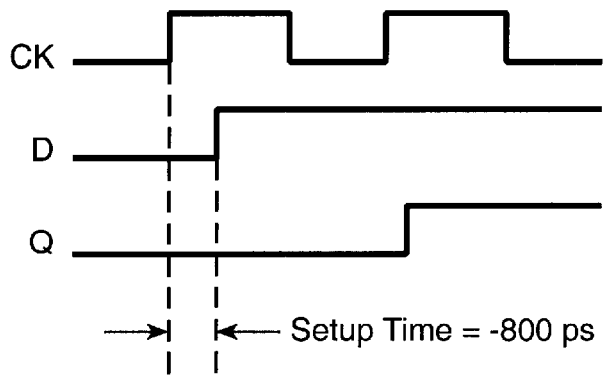
FIG._2B
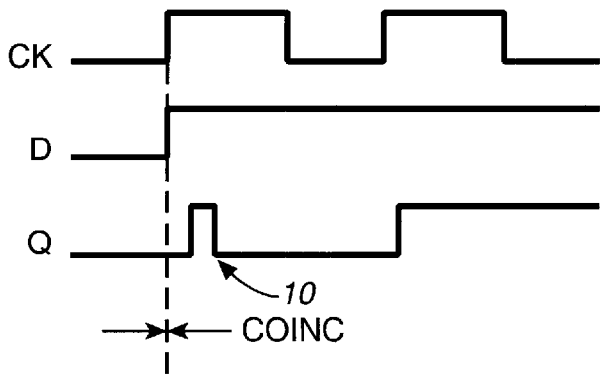
FIG._2C

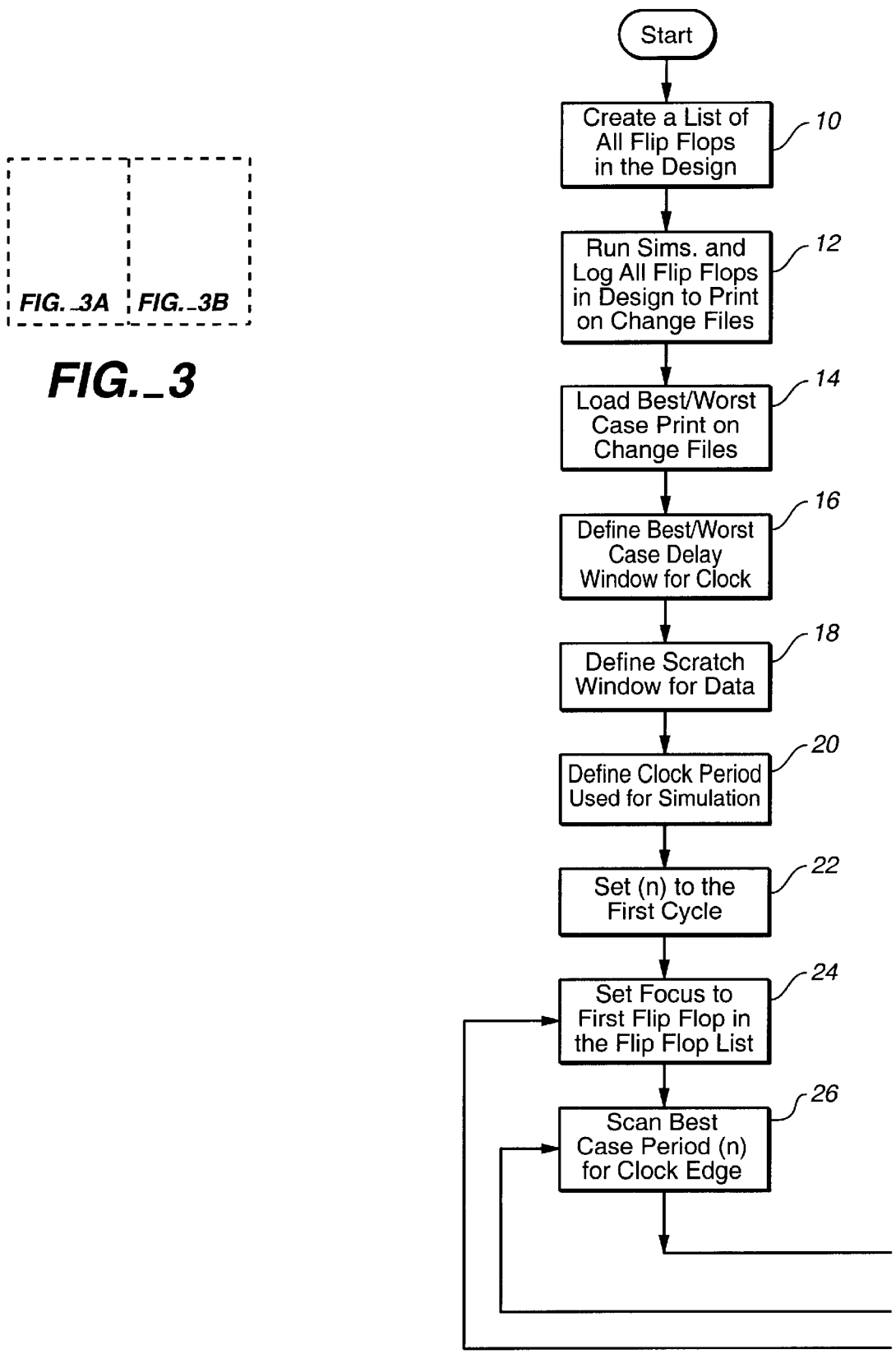
FIG._3
FIG._3A

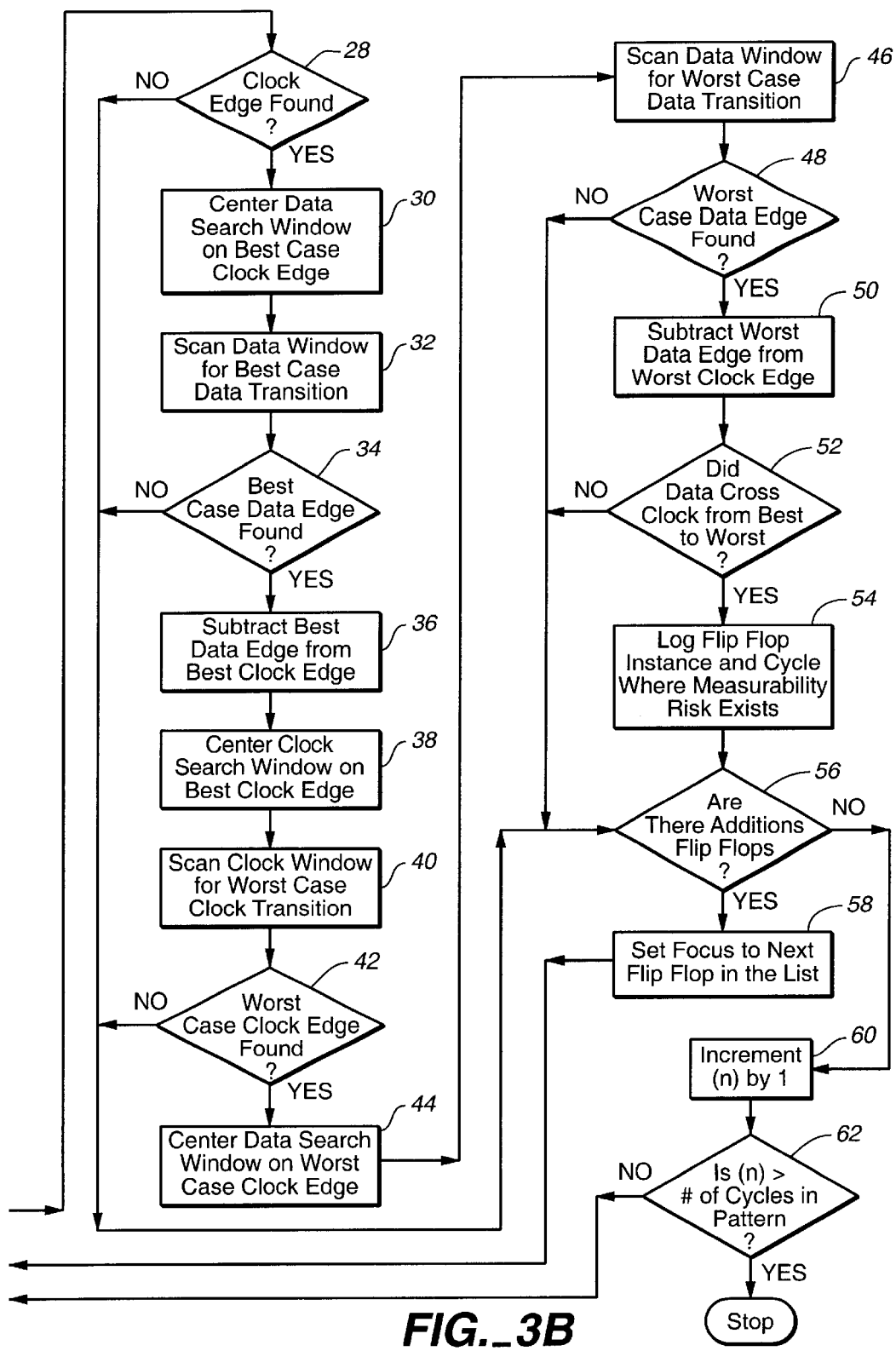
FIG._3B

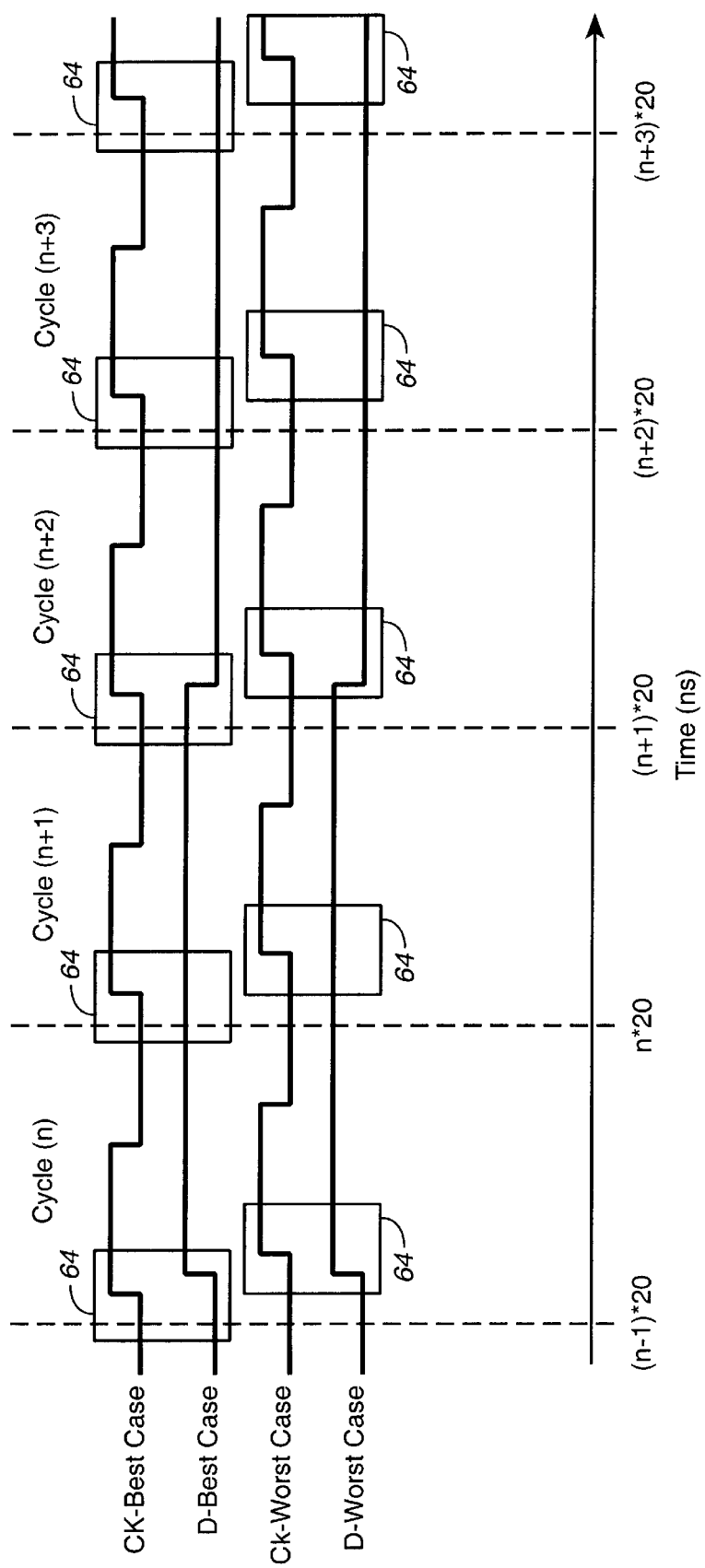
FIG._4

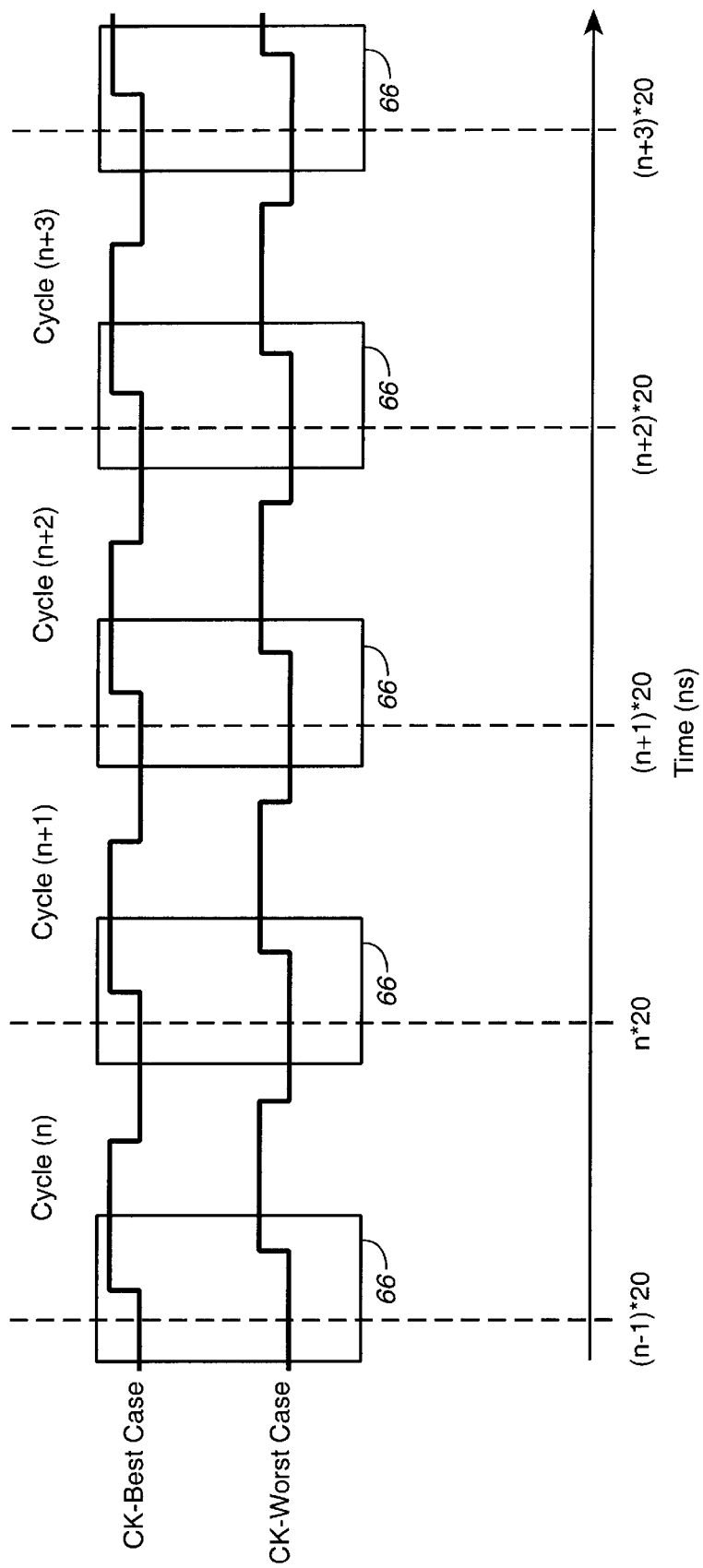
FIG._5

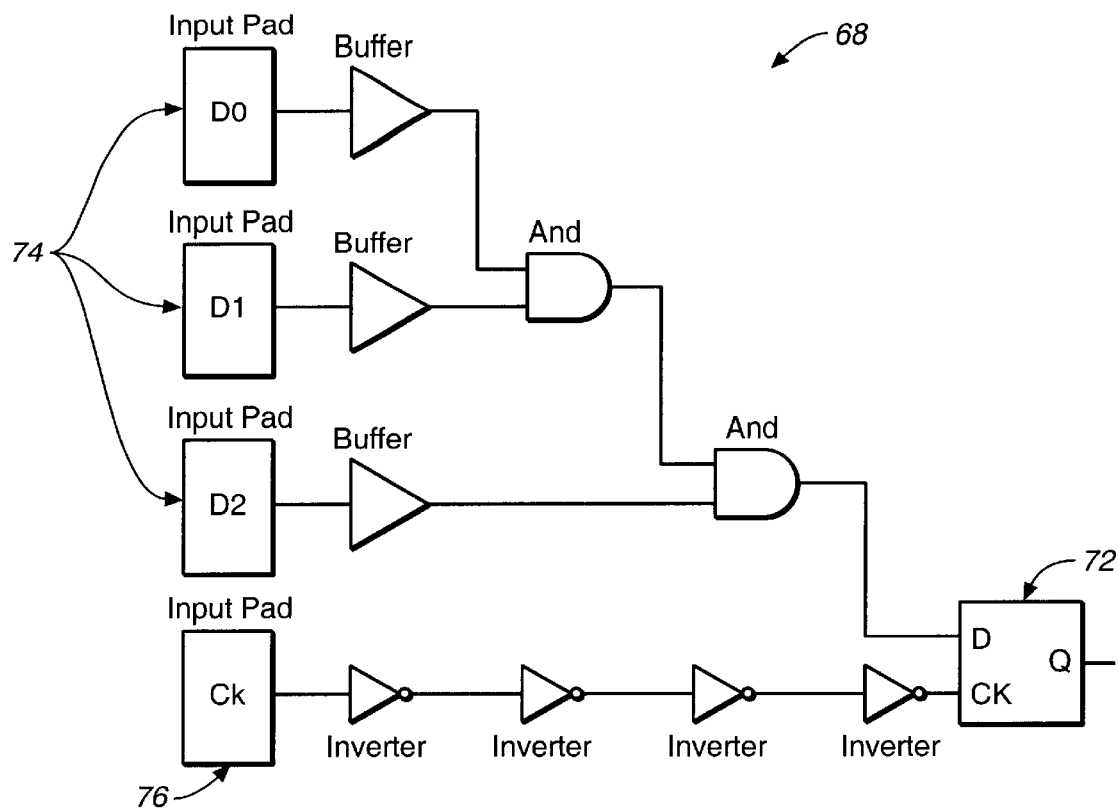
FIG._6

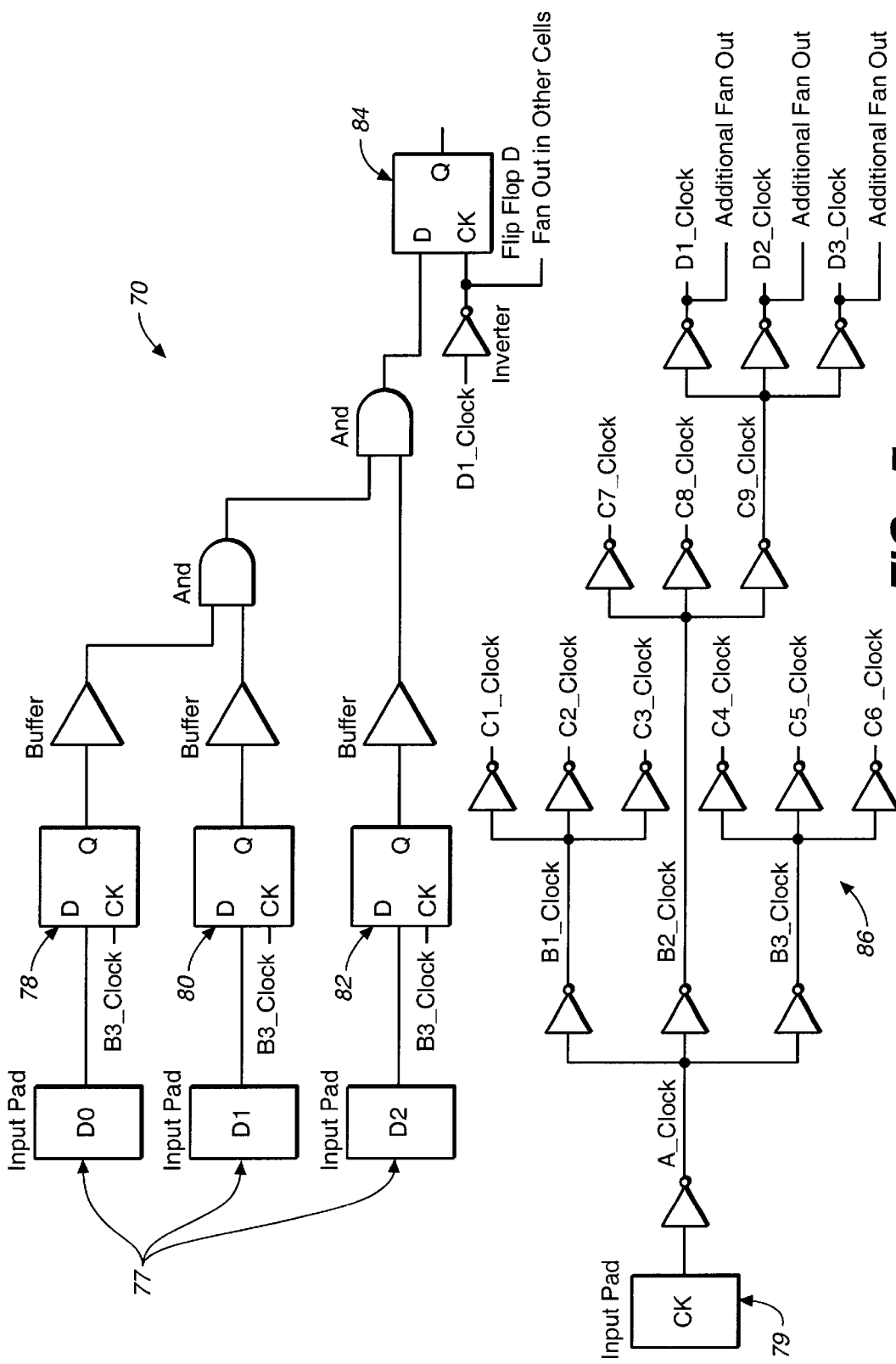
FIG._7

METASTABILITY RISK SIMULATION ANALYSIS TOOL AND METHOD

The present invention relates generally to apparatuses and methods for performing metastabilty analyses of designs which include one or more synchronous elements. The present invention more specifically relates to an apparatus and method which can be used to assess whether a design presents a metastability risk.

BACKGROUND OF THE INVENTION

Typically, simulation tests, such as best case and worst case simulations, are performed on designs which contain one or more synchronous elements. These simulations produce one or more simulation files (e.g. print on change files) which contain information regarding times at which data and clock signals changed during the simulation. This information can be reviewed to determine whether the design is acceptable.

Best and worst case simulations may indicate that either the data signal or the clock signal leads the other with plenty of margin. For example, best case simulations may show the data signal leading the clock signal with plenty of margin, and worst case simulations may show the clock signal leading the data signal with plenty of margin. Both of these conditions may be acceptable for the system function. However, if data and clock of a synchronous element reverse position over best and worst case, it is a definite metastability risk because at some point in time, the data and clock signals transition at the same time.

A metastability risk may result from either internal or external conditions. Internal metastability issues are caused by clock and data paths that cross each other over temperature, process and voltage. Externally driven metastability risks may result due to clock being asynchronous with respect to data, or due to externally driven signals having large delay shifts over temperature, process and voltage. These delay shifts may be due to long interconnect routes from the I/O ring to the core logic.

Unless great care is taken, metastability risks may exist within a design without a designer's knowledge. Since simulations, such as worst case and best case simulations, are discreet points and are digital in nature, they may not identify metastability risks. Unless a simulation is run at the proper condition, a setup or hold time violation may not occur during the simulation even though a potential metastability condition exists.

Metastability is not acceptable for system performance and may even cause an intermittent system failure. Additionally, metastability can cause serious system level problems that are very difficult to debug. As a result, metastability issues could result in lengthy debug efforts, unnecessary redesigns and costly design schedule impacts.

It is desirable to know whether a design is at risk for metastability, and which synchronous elements in a design present metastability risks. If a designer were to know which synchronous elements in a design present a metastability risk, the designer could take corrective action. For example, the designer could change the path delays such that the data and clock signals no longer cross over each other, or the designer could replace the synchronous element with a synchronizer cell that is less susceptible to metastability, thus minimizing the overall risk of metastability. The designer could also use the tool as a debug device once metastability is suspected in silicon.

OBJECTS AND SUMMARY

It is an object of the present invention to provide an apparatus and method which can be used to assess whether a design presents a metastability risk.

It is a further object of the present invention to provide an apparatus and method for analyzing simulation information to identify metastability risks of a design.

In accordance with these and other objects, the present invention provides a metastability risk simulation analysis device and a method of using a metastability risk simulation analysis device to identify metastability risks of a design. The metastability risk simulation analysis device includes computer readable code which is configured to analyze simulation information relating to the design and determine whether the design presents a metastability risk.

Desirably, the computer readable code is configured to determine whether two signals, such as a data signal and a clock signal of a synchronous element of the design, cross over each other thereby presenting a metastability risk, and is configured to generate a summary report identifying those synchronous elements of the design which present a metastability risk. Preferably, the computer readable code is configured to analyze simulation information relating to best case and worst case simulations of the design, and is configured to scan the simulation information to identify an edge of a clock signal and an edge of a data signal of the best case and worst case simulations and determine whether the signals cross each other.

Preferably, the computer readable code is configured to scan the simulation information to identify an edge of a clock signal of the best case simulation and associate a data search window on the edge of the clock signal of the best case simulation, and the computer readable code is configured to scan the data search window associated on the edge of the clock signal of the best case simulation to determine whether the data signal of the best case simulation transitions within the data search window. Also, preferably the computer readable code is configured to determine how much the data signal and clock to signal of the best case simulation lead each other, is configured to associate a clock search window on the edge of the clock signal of the best case simulation, and is configured to scan the clock search window associated with the edge of the clock signal of the best case simulation to determine whether the clock signal of the worst case simulation transitions within the clock search window. Still further, preferably the computer readable code is configured to associate a data search window on the edge of the clock signal of the worst case simulation, and is configured to scan the data search window associated with the edge of the clock signal of the worst case simulation to determine whether the data signal of the worst case simulation transitions within the data search window. Still even further, preferably the computer readable code is configured to determine how much the data signal and clock signal of the worst case simulation lead each other, and is configured to determine whether the data signals and clock signals cross over each other from the best case simulation to the worst case simulation. Ideally, the computer readable code is configured to analyze simulation information relating to best case and worst case simulations of the design with regard to a plurality of synchronous elements of the design.

BRIEF DESCRIPTION OF THE DRAWINGS

The present invention and the advantages thereof will become more apparent upon consideration of the following detailed description when taken in conjunction with the accompanying drawings of which:

FIG. 1 is a view of contents of an illustrative print on change file which contains simulation information relating to the transitions of two signals, a data signal and a clock signal;

FIGS. 2a, 2b and 2c are exemplary simulation waveforms relating to a worst case simulation, a best case simulation, and a silicon metastability condition, respectively;

FIG. 3 is a flow chart illustrating a configuration of computer program code and method in accordance with an embodiment of the present invention;

FIG. 4 depicts sample waveform displays of best and worst case simulations showing flip flop timings, and illustrating data search windows;

FIG. 5 depicts sample clock waveforms relating to best and worst case simulations illustrating clock search windows;

FIG. 6 illustrates an example of an externally driven metastable circuit; and

FIG. 7 illustrates an example of an internally driven metastable circuit.

DETAILED DESCRIPTION OF AN EMBODIMENT OF THE INVENTION

One or more simulations may be performed on a design to ensure that the transitions of signals relating the synchronous elements of the design are acceptable. The simulations produce certain data files, commonly referred to as "print on change files", which subsequently may be examined to determine whether the signal transitions are acceptable.

FIG. 1 depicts the contents of an illustrative print on change file where the file contains simulation information relating to the transitions of two signals, a data signal ("flipflopa_d") and a clock signal ("flipflopa_ck"), of a synchronous element ("flipflopa") of a design. The left hand column contains the simulation time ("time (ns)") where one of the signals, the data signal, "flipflopa_d", or the clock signal, "flipflopa_ck", changed states during the simulation. The center column and the right column show signal nets, "flipflopa_ck" and "flipflopa_d", respectively. While FIG. 1 shows two signal nets, the number of nets logged to the file is controlled by the designer, and more or less signal nets may be logged to the file.

As shown in FIG. 1, each time there is a state change or transition on any logged signal, the time is entered into left column ("time (ns)") along with the values of the two signals ("flipflopa_ck" and "flipflopa_d") being entered into the next two columns.

There are various forms of print on change files, and that which is depicted in FIG. 1 is intended only to be exemplary. However, print on change files typically include information relating to the transitions of one or more signals which occur during a simulation.

An embodiment of the present invention provides software or computer readable program code which is configured to analyze simulation information, such as print on change files, to determine whether the design presents a metastability risk. In other words, the software is a metastability risk simulation analysis device which preferably supplements existing simulations and post processes simulation information to identify metastability issues which exist in the design.

If data and clock signals of a synchronous element reverse position over best and worst case, it is a definite metastability risk. For example, the waveforms depicted in FIGS. 2a and 2b are exemplary simulation waveforms relating to worst and best case simulations, respectively. In the worst case simulation, as shown in FIG. 2a, the data signal ("D") leads the clock signal ("CK") with sufficient margin. In the best case simulation, as shown in FIG. 2b, the clock signal ("CK") leads the data signal ("D") with sufficient margin. Because one signal leads the other in one case, and then lags the other in the other case, a metastable condition occurs at some point between the best and worst case, and FIG. 2c depicts this point in time. As shown in FIG. 2c, the metastable condition occurs because at some point (point "COINC") between best and worst case process, temperature and voltage, the two signals, clock ("CK") and data ("D"), become coincident. As shown in FIG. 2c, the coincidence causes a pulse or glitch 10 in output "Q", or may cause the output "Q" to oscillate for some time.

Preferably, the software in accordance with an embodiment of the present invention is configured to analyze simulation information which is contained in one or more print on change files, such as is shown in FIG. 1, where the simulation information relates to transitions in waveforms such as are shown in FIGS. 2a and 2b. The software preferably analyzes the simulation information to assess metastability issues, and generates an output file which can be reviewed by a designer to identify metastable conditions that exist in the design. Typically, the designer will also examine the logic associated with the synchronous elements identified to present a metastability risk to understand and evaluate if a metastability condition can be tolerated by the system with respect to that particular element. If not, the designer may replace the synchronous element with one which is more stable, or the designer may change the design in some other manner to avoid the metastability condition.

FIG. 3 is a flow chart depicting how software in accordance with an embodiment of the present invention is preferably configured to function. As shown (see box 10), preferably the software creates a list of all synchronous elements, i.e. flip flops, in the design. Then, best and worst case simulations are run on the design, and all of the synchronous elements, i.e. flip flops, in the design including their clock and data inputs are logged to a print on change file (see box 12). Then, the software loads the print on change files associated with the best and worst case simulations (see box 14), defines a best and worst case delay window for the clock signal (see box 16), defines a search window for data (see box 18), and defines a clock period used for the simulation (see box 20). Then, the software sets a variable (n) to the first cycle (see box 22), sets the focus to the first Flip Flop in the list (see box 24), and scans the best case period (n) for the clock edge (see box 26). If the clock edge is found (see diamond 28), the software preferably centers, or otherwise associates, the data search window on the best case clock edge (see box 30), and scans the data window for the best case data transition (a data signal edge) (see box 32). If the best case data edge is found (see diamond 34), the software preferably subtracts the best case data edge from the best case clock edge (see box 36), centers, or otherwise associates, the clock search window on the best case clock edge (see box 38), and scans the clock window for the worst case clock transition (a clock signal edge) (see box 40). If the worst case clock edge is found (see diamond 42), the software preferably centers, or otherwise associates, the data search window on the worst case clock edge (see box 44), and scans the data window for the worst case data transition (a data signal edge) (see box 46). If the worst case data edge is found (see diamond 48), the software preferably subtracts the worst case data edge from the worst case clock edge (see box 50) and determines whether the data signal crossed the clock signal from best to worst (see diamond 52). If so, the software preferably logs the flip flop instance and cycle where the metastability risk exists (see box 54). If there are no additional flip flops in the design (see diamond 56), the software preferably increments the variable (n) by 1 (see box 60), and determines whether the variable (n) is greater than the number of cycles in the pattern (see diamond 62). If so, the software preferably stops. If not, the software preferably sets the focus to the first flip flop in the list (see box 24), scans the best case period (n) for the clock edge (see box 26) and repeats the process with regard to identifying signal edges, centering, or otherwise associating search windows on the edges, and scanning the search windows for transitions in order to identify metastability issues with regard to the remaining flip flops in the design which are listed in the list the software initially created. At diamond 56, if there are additional flip flops, the software preferably sets the focus to the next flip flop in the list (see box 58), and scans the base case period (n) for the clock edge (see box 26). Other aspects of the preferred configuration and functioning of the software are readily apparent from reviewing the flow chart appearing in FIG. 3.

As mentioned above, after the software loads the print on change files associated with the best and worst case simulations (see box 14), and defines a best and worst case delay window for the clock signal (see box 16), the software preferably defines a search window for data (see box 18). Preferably, the search window is less than the clock period used for generating the simulations. For example, FIG. 4 shows data search windows 64 of 6 ns surrounding the clock edges with a clock period of 20 ns. This allows the software to find the data closest to the clock edges and most likely to cross the clock edges of each flip flop. The data windows 64 are used to find the data edge transitions related to the clock edges for each best and worst case simulation. The software preferably does not compare data from the best case simulation with clock from the worst case simulation or vice versa.

As mentioned above, the software defines a search window for the clock to provide that the software can identify clock edges that are related between best and worst case simulations. This clock search window is preferably less than one clock cycle. FIG. 5 illustrates an example of clock search windows 66 of 10 ns surrounding the clock edges with a simulation clock period of 20 ns.

From the flow chart depicted in FIG. 3, it can be seen that it is preferred that the software be configured to examine every flip flop in every cycle in the best and worst case simulation runs (see diamond 56, etc.). If the data signal leads the clock signal in the best case simulation, and then the data signal lags the clock signal in the worst case simulation, the software preferably logs that cycle and flip flop to an output report file (see box 54). Likewise, if the data signal lags the clock signal in the best case simulation, and then the data signal leads the clock signal in the worst case simulation, the software also preferably logs that cycle and flip flop to an output report file (see box 54). As discussed above, the designer can subsequently examine the output report file to get an appreciation for metastable conditions that exist in the design.

FIGS. 6 and 7 illustrate two circuits 68 and 70, respectively, which software in accordance with an embodiment of the present invention may be employed to analyze for metastability issues. Specifically, FIG. 6 illustrates an example circuit 68 where a metastable condition results in an Application Specific Integrated Circuit (ASIC) 72 from external data and clock signals ("D" and "CK", respectively). The clock signal, "CK", feeding into the ASIC or sub-circuit 72 illustrated in FIG. 6 is not synchronized with the data bus feeding into the ASIC or sub-circuit 72. The data bus (D0, D1, D2) 74 may be coming from another chip on the circuit board that uses a different clock than the clock 76 feeding into the ASIC sub-circuit 72 shown in FIG. 6. The data bus 74 may come from another system with an independent clock connected by cables. This can be modeled by controlling the data bus 74 in simulation such that the data signal "D" clearly lags the clock signal "CK" in one simulation, and the data signal "D" clearly leads the clock signal "CK" in another simulation. A test bench could be set up between best and worst case that would externally skew the clock and data signals and effectively show synchronous elements where the data and clock signals cross over each other. This type of test bench would be useful with truly asynchronous designs or systems. Software configured in accordance with the flow-chart depicted in FIG. 3 will preferably identify, and preferably report to the output report file, all of the flip flops affected by the asynchronous system behavior.

FIG. 7 shows a circuit 70 that can be susceptible to an internally driven metastable condition. In FIG. 7, reference numeral 77 indicates a synchronous data bus and reference numeral 79 indicates a synchronous clock. Flip flops 78, 80 and 82 are controlled by B3_Clock. Flip Flop 84 is controlled by D1_Clock. It is possible that the interconnect loading on the clock tree 86 at points C9_Clock, D1_Clock as well as the fan out may cause significant variation in propagation delay over temperature, process and voltage. The load on the data paths may be very light and cause much less variation in propagation delay over temperature, process and voltage. The condition at Flip Flop 84 may be similar to that shown in FIG. 6. If the output ("Q") of Flip Flop 84 is used as a clock for a counter or state machine, the metastable oscillation will cause an invalid count or state machine changes and result in system failure.

Once the metastable condition is identified using the software, one way to potentially eliminate the metastability risk would be to replace the D1_Clock line feeding Flip Flop 84 with an earlier version from the clock tree 86. For example, B2_Clock may be used instead. In this case (although not shown), the clock signal will always lead the data signal and avoid the metastable condition over temperature, process and voltage. As long as the circuitry downstream of Flip Flop 84 can tolerate the output ("Q") from Flip Flop 84 arriving earlier, the system will work correctly as a result of the change.

Preferably, software in accordance with an embodiment of the present invention allows circuit designers to find and avoid metastable conditions that exist in a design. This is important because metastable conditions that occur in system level applications are typically extremely difficult to find and debug at the chip level and system level in that there may not be a failure until after several hours or days of operation. The metastable condition may be very intermittent and difficult to control or reproduce during failure analysis. Therefore, several days or weeks may be spent trying to identify the problem resulting in a delay in the time it takes to have the product go to market.

While a preferred embodiment of the present invention is shown and described, it is envisioned that those skilled in the art may devise various modifications of the present invention without departing from the spirit and scope of the appended claims.

What is claimed is:

1. A metastability risk simulation analysis device for identifying metastability risks of a design, said metastability risk simulation analysis device comprising computer readable code operable with computer means for operating the code, said computer readable code configured to analyze simulation information relating to the design to determine whether the design presents a metastability risk, wherein said computer readable code is configured to analyze simulation information relating to best case and worst case simulations of the design, wherein said computer readable code is configured to scan the simulation information to identify an edge of a clock signal and an edge of a data signal of the best case and worst case simulations and determine whether said clock and data signals cross each other.

2. A metastability risk simulation analysis device for identifying metastability risks of a design, said metastability risk simulation analysis device comprising computer readable code operable with computer means for operating the code, said computer readable code configured to analyze simulation information relating to the design to determine whether the design presents a metastability risk, wherein said computer readable code is configured to analyze simulations information relating to best case and worst case simulations of the design, wherein said computer readable code is configured to scan the simulation information to identify an edge of a clock signal of the best case simulation and associate a data search window on the edge of the clock signal of the best case simulation, and wherein said computer readable code is configured to scan the data search window associated on the edge of the clock signal of the best case simulation to determine whether the data signal of the best case simulation transitions within the data search window.

3. The metastability risk simulation analysis device of claim 2, wherein said computer readable code is configured to determine how much the data signal and clock signal of the best case simulation lead each other, is configured to associate a clock search window on the edge of the clock signal of the best case simulation, and is configured to scan the clock search window associated with the edge of the clock signal of the best case simulation to determine whether the clock signal of the worst case simulation transitions within the clock search window.

4. The metastability risk simulation analysis device of claim 3, wherein said computer readable code is configured to associate a data search window on the edge of the clock signal of the worst case simulation, and is configured to scan the data search window associated with the edge of the clock signal of the worst case simulation to determine whether the data signal of the worst case simulation transitions within the data search window.

5. The metastability risk simulation analysis device of claim 4, wherein said computer readable code is configured to determine how much the data signal and clock signal of the worst case simulation lead each other, and is configured to determine whether the data signals and clock signals cross over each other from the best case simulation to the worst case simulation.

6. The metastability risk simulation analysis device of claim 5, wherein said computer readable code is configured to analyze simulation information relating to best case and worst case simulations of the design with regard to a plurality of synchronous elements of the design.

7. The metastability risk simulation analysis device of claim 2, wherein said computer readable code is configured to associate a data search window on the edge of the clock signal of the worst case simulation, and is configured to scan the data search window associated with the edge of the clock signal of the worst case simulation to determine whether the data signal of the worst case simulation transitions within the data search window.

8. The metastability risk simulation analysis device of claim 2, wherein said computer readable code is configured to determine how much the data signal and clock signal of the worst case simulation lead each other, and is configured to determine whether the data signals and clock signals cross over each other from the best case simulation to the worst case simulation.

9. The metastability risk simulation analysis device of claim 2, wherein said computer readable code is configured to analyze simulation information relating to best case and worst case simulations of the design with regard to a plurality of synchronous elements of the design.

* * * * *